United States Patent
Baumgartner et al.

(10) Patent No.: US 8,201,118 B2
(45) Date of Patent: Jun. 12, 2012

(54) METHOD AND SYSTEM FOR DYNAMIC AUTOMATED HINT GENERATION FOR ENHANCED REACHABILITY ANALYSIS

(75) Inventors: Jason R. Baumgartner, Austin, TX (US); Paul J. Roessler, Austin, TX (US); Mark A. Williams, Pleasant Valley, NY (US); Jiazhao Xu, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 12/475,494

(22) Filed: May 30, 2009

(65) Prior Publication Data

US 2011/0016441 A1    Jan. 20, 2011

(51) Int. Cl.
*G06F 17/50* (2006.01)
(52) U.S. Cl. .......... 716/107; 716/111; 716/136
(58) Field of Classification Search .......... None
See application file for complete search history.

(56) References Cited

U.S. PATENT DOCUMENTS

| | | | |
|---|---|---|---|
| 6,421,815 B1 | 7/2002 | Seawright | |
| 6,567,959 B2 | 5/2003 | Levin et al. | |
| 6,944,838 B2 | 9/2005 | McMillan | |
| 7,092,858 B1 | 8/2006 | Kukula et al. | |
| 7,127,686 B2 | 10/2006 | Drechsler et al. | |
| 7,203,915 B2 * | 4/2007 | Baumgartner et al. | 716/113 |
| 7,246,331 B2 | 7/2007 | Ward | |
| 7,308,657 B2 | 12/2007 | Ward | |
| 7,322,017 B2 * | 1/2008 | Baumgartner et al. | 716/104 |
| 7,340,473 B2 * | 3/2008 | Paruthi et al. | 707/803 |
| 7,475,370 B2 * | 1/2009 | Baumgartner et al. | 716/106 |
| 7,788,615 B2 * | 8/2010 | Baumgartner et al. | 716/103 |
| 7,788,646 B2 * | 8/2010 | Ward | 717/132 |
| 2004/0098683 A1 | 5/2004 | Maruyama et al. | |
| 2006/0085782 A1 | 4/2006 | Ward | |
| 2006/0129958 A1 * | 6/2006 | Raymond et al. | 716/5 |
| 2007/0033552 A1 | 2/2007 | Li | |
| 2007/0089075 A1 | 4/2007 | Ward | |
| 2008/0052650 A1 * | 2/2008 | Baumgartner et al. | 716/5 |
| 2008/0066031 A1 * | 3/2008 | Baumgartner et al. | 716/5 |
| 2008/0222590 A1 | 9/2008 | Jacobi | |
| 2011/0016441 A1 * | 1/2011 | Baumgartner et al. | 716/107 |

OTHER PUBLICATIONS

Ward, David et al., Automatic Generation of Hints for Symbolic Traversal, Conference on Hardware Design and Verification Methods (CHARME) 2005, pp. 207-221, 2005.*
Ward, David et al., Hints to Accelerate Symbolic Traversal, Conference on Hardware Design and Verification Methods (CHARME), pp. 250-266, 1999.*
Govindaraju et al., "Improved Approximate Reachability Using Auxilary State Variables" (Design Automation Conference Proceedings, 36th, pp. 312-316 (Abstract); Jun. 21, 1999.

(Continued)

*Primary Examiner* — Leigh Garbowski
*Assistant Examiner* — A. M. Thompson
(74) *Attorney, Agent, or Firm* — Brevetto Law Group

(57) ABSTRACT

Methods and systems are provided for dynamically generating a hint set for enhanced reachability analysis in a sequential circuitry design that is represented by a Binary Decision Diagram (BDD). After determining a ranking of the BDD variables, they are sorted in the order of the ranking. The ranking is used to select some of the variables for use in creating hints for more efficiently performing the reachability analysis in a creating an equivalent sequential circuitry design.

15 Claims, 4 Drawing Sheets

OTHER PUBLICATIONS

Per Bjesse; "DAG Aware Circuit Compression for Formal Verification"; Proceedings of 2004 Int'l Conf. on CAD; IEEE catalog No. 04CH37606; ACM Order Dept. PO Box 11414, New York, NY 10286-1414; Nov. 7, 2004.

* cited by examiner

METHOD AND SYSTEM FOR DYNAMIC AUTOMATED HINT GENERATION FOR ENHANCED REACHABILITY ANALYSIS

BACKGROUND

1. Field of the Invention

The present invention relates to digital circuitry designs of state machines, and more specifically, to systems, methods and computer products for efficiency improvements in the digital circuitry designs.

2. Description of Related Art

An electrical circuit with memory elements may be modeled using state equations and state variables to describe the behavior and state of the system. A complete set of state variables for a system, coupled with logic that defines the transitions between states, typically contains enough information about the system's history to enable computation of the system's future behavior. Simplifying the model to reduce the number of state variables, or simplifying the logic that defines state transitions, lessens the computational cost of analyzing the model. A simplified model should be subjected to verification analysis to verify its equivalence to the original circuit model.

Many conventional verification proof algorithms rely upon reachability analysis, which requires enumerating the reachable states of the design under test to assess whether the design conforms to its specification, which unfortunately is a size-limited process. Certain gates of the model may be labeled as targets. Targets correlate to the properties we wish to verify. One goal of the verification process is to find a way to drive a "1" to a target node, or to prove that no such assertion of the target is possible—that is, to verify whether or not the target node is reachable.

Reachability analysis can identify whether a proposed design satisfies its specification. If all reachable states of a design satisfy the property being verified, then a correctness proof has been completed and the proposed design is known to satisfy its specification. Reachability analysis can also identify whether the design does not satisfy its specification if it is determined that some reachable state does not satisfy the property being verified. Symbolic space traversal using Binary Decision Diagrams (BDD) is a well established technique in reachability analysis. The breadth-first traversal starts from the initial states and computes all the reachable states in one time step and represents all the reached states (including the initial states) using a BDD. If there are new states reached in that image computation then in subsequent steps states that are reachable from the newly reached states will be explored. This process of reachability analysis will eventually converge since the state space being searched in the hardware design is normally finite.

The powerful technique of reachability analysis has one Achilles heel, that is—the state explosion we might encounter during the image computation. The intermediate BDD that represent a set of reachable states at kth depth can have such a large representation and push the computation above its memory resource. Techniques have been proposed to overcome this state explosion problem caused by the intermediate BDDs. For example, applying hints to guide the state exploration is one of the effective techniques that create opportunities to overcome the computational bottleneck of representing monstrous intermediate BDDs, as described in "Hints to accelerate Symbolic Traversal" by Kavita Ravi and Fabio Somenzi CHARME 1999, pp. 250-264. Hints are constraints on the transition relation of the circuit being verified. Hints are expressed as constraints on the primary inputs and the states of a circuit which is modeled as a finite transition system. During the reachability analysis a set of hints are applied in sequence, and the final converged reachable states of one hint application will be served as the initial state of the next hint application, with the last hint to be the constant 1, which indicates that it offers no constraining power on the transition relation.

Conventional systems generate hints manually with the help of simple heuristics by someone who understands the circuit well enough to devise simulation stimuli or verification properties for it. However, finding good hints requires one to constrain the transition system in such a way that only small intermediate BDDs arise during image computations that produce large numbers of reachable states. The practice of finding good hints is limited by the user's ability to predict their usefulness, often requiring a significant amount of manual trial-and-error.

Another effort in the automatic hints generation is that of Somenzi and Ward as described in "Automatic Generation of Hints for Symbolic Traversal," CHARME 2005; pps. 207-221. Somenzi and Ward present a method intended to statically and automatically determine good hints. Working on the control flow graph(s) of a behavioral model of the circuit being analyzed, their algorithm extracts sets of related execution paths each corresponds to enabling predicates which trigger various control flow paths as a candidate hint. However, that approach requires a very specific design representation to be able to work—namely, a behavioral hardware description languages (HDL) model. In practice, such models tend not to be available because high-performance hardware designs (e.g. multi-gigahertz) are pipelined to the extent that behavioral representations are not available whatsoever; even control flows are pipelined in the source HDL. Further, formal verification often requires preprocessing using bit-level design optimization techniques prior to BDD-based reachability, e.g., retiming and redundancy removal. Such transformations require a synthesized bit-level model of a design, and produce the same. Various embodiments of the present invention eliminate both of these limitations by operating directly on a bit-level synthesized netlist.

What is needed is an improved system for automatically generating and applying hints to aid in the reachability analysis for verifying improved circuitry designs.

SUMMARY

Embodiments disclosed herein address the above stated needs by providing systems, methods and computer program products for dynamically generating a hint set for enhanced reachability analysis in a sequential circuitry design represented by a binary decision diagram. This may be done by determining a ranking of first plurality of variables for binary decision diagram and sorting the first plurality of variables in order of the ranking. Once the variables have been sorted according to rank, a second plurality of variables can be selected from among the first plurality of variables for use in creating a hint based on the selected variables to be included in said hint set. Further embodiments perform a hint based reachability analysis using the hint set.

In at least some embodiments the hint set is completed before beginning the hint based reachability analysis. In other embodiments the hints are created on the fly during performance of the hint based reachability analysis.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1:
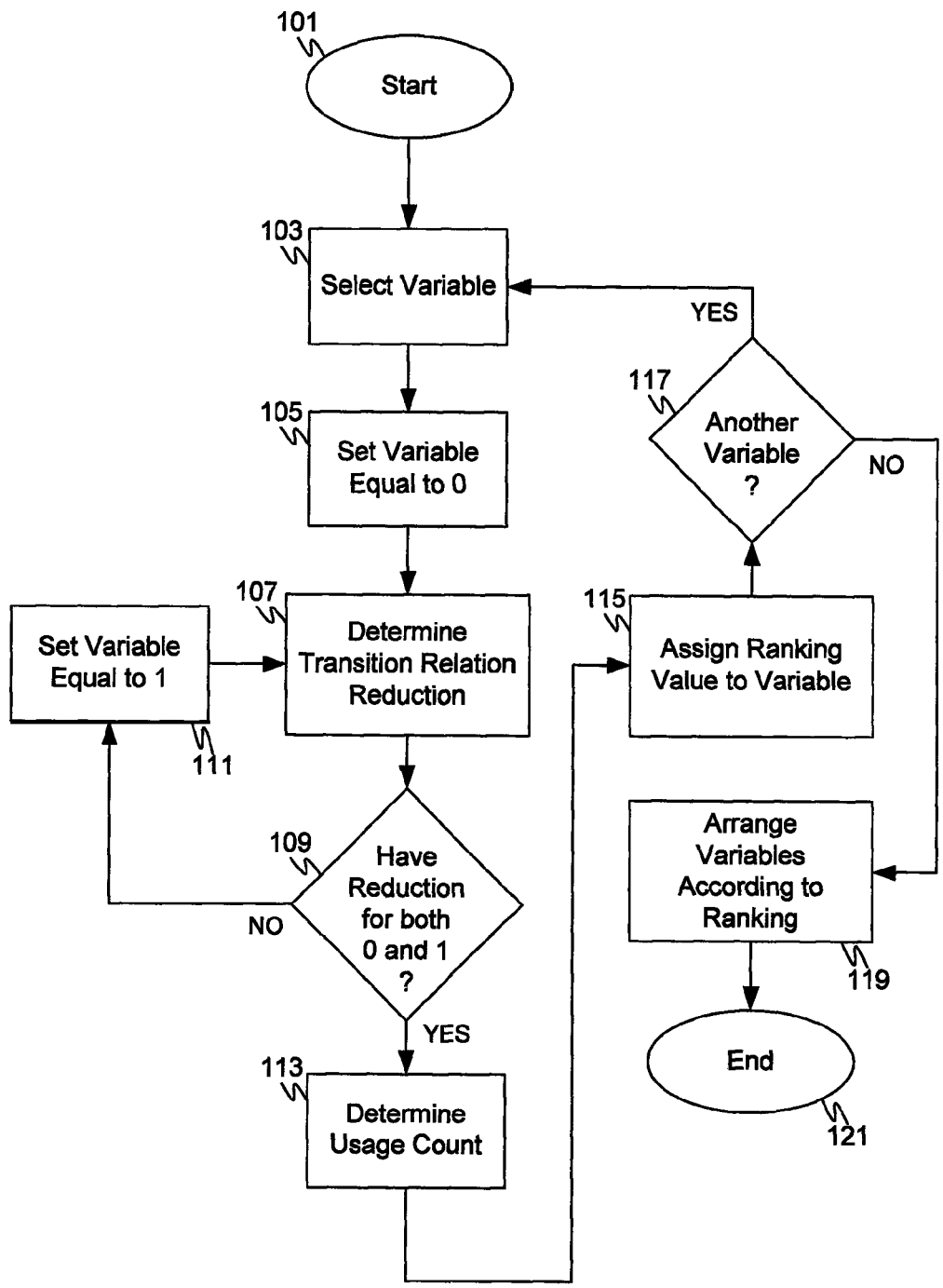
FIG. 1 is a flowchart for a method of ranking variables to be used in the generation of hints for a reachability analysis according to various embodiments of the invention.

Various embodiments of the present invention are drawn to the automatic generation of a set of hints over inputs and state variables. The various embodiments for automatic hint generation may be implemented within a reachability analysis engine. While almost any hint can help the reachability analysis to some extent, some factors can affect the effectiveness of a sequence of hints, such as the order of the hints that are applied as well as complexity for the final refinement step. In practice we observed that often a cube hint—a hint that restricts specific inputs and state variables to be certain constants can be very effective in hardware verification. Applying the set cube hints in a sequence where the subsequent hint has fewer literals than its predecessor often provides a gradual enlargement of the search space with a small intermediate BDD size. More generally, our technique can be used to constrain any signals in the design.

One of the features that may be realized using the various embodiments is the automatic generation of hints at difficult parts of the computation when intermediate BDD size becomes very large. Another beneficial feature is the generation of a BDD hint cube that can best constrain the transition relation and reduce the complexity. Furthermore, various embodiments dynamically can decide a less constraining cube to produce for the subsequent hint application. The heuristics used in our methods is related to the number of BDD nodes at a given moment of the computation and takes into consideration that the BDD variable order may change during the course of the reachability analysis.

Various embodiments of the present invention overcome limitations of conventional systems by operating directly on a bit-level synthesized netlist. Furthermore, technique of the various embodiments are substantially more general than those of conventional systems since at least some of the embodiments consider applying hints over any inputs or state elements of the design by analyzing which have the biggest impact on simplifying the analysis, not just over control-flow related paths. For example, in attempting to verify arithmetic circuits, often hints over data-related signal traces are necessary. Furthermore, since the approach of the present invention can be used to generate hints over any signal trace in the design (not just inputs or state elements), it also can readily capture control-flow predicates in synthesized designs.

Automatic generation of a set of hints over inputs and state variables may be implemented in a reachability analysis engine. In at least one embodiment the generated hints are simple cubes which constrain certain inputs and state elements to constants. The choice of the hints form to be simple cubes is mainly based on empirical experimental data, and on the theoretical result that bdd_constrain operation can be very efficient given cubes. The bdd_constrain operation can be applied in place of a bdd_and operation to constrain an image step to yield a much more efficient implementation of the computation. Typically, the first hint contains the most literals. Subsequent hints can be created from their immediate predecessor by removing one or more literals from the prior hint. The decision of when to generate the hints can be based on dynamic heuristics in the course of the reachability analysis to provide an optimal control of the BDD node growth rate.

FIG. 1 depicts the flowchart 100 of a method for ranking variables used in automatic hint generation. The various embodiments involve two main aspects, automatic hint generation based on the variable rankings as well as dynamic hint generation and application of hints. For automatic hints generation based on the variable rankings a ranking scheme is used to order the variables. The hints are then created from the variables having the highest ranking. The rank of a variable may be determined by up to three pieces of information. For example, variable rank may be affected by how much the transition relation is reduced in size if the variable is set to 0. Variable rank may also be affected by how much the transition relation is reduced in size if the variable is set to 1. Another consideration of variable rank is the usage count of the variable provided by the BDD package (e.g., bdd_var_usecount).

Returning to FIG. 1, the method begins at 101 and proceeds to 103 to select a variable for analysis. In 105 the variable is set to zero, and the method proceeds to 107. Note that typically a variable is not allowed to be set to a value that will violate any user-specified constraints. Furthermore, state variable assignments are not allowed to conflict with the initial states for static hint generation, or with the current set of reached states for dynamic hint generation. For the purposes of the pseudocode provided below, the sets of current reached states are considered as another "constraint." In block 107 the transition relation reduction is determined. The size of the transition relation (TR) is defined to be the sum of the sizes of its next-state functions. The transition relation reduction amount over a BDD literal is the difference between the TR size before vs. after constraining the variable to a constant (by using bdd_constrain operation over the vector of next-state BDDs), and the reduction amount can be used to determine the rank of a signal to use in a hint. Upon completing 107 the method proceeds to see whether the transition relation reduction has been determined for both 0 and 1. If not, the method proceeds from 109 along the NO path to 111 to set the selected variable to 1. The method then passes to 107 to again determine transition relation reduction, this time for the variable being set to 1. If it is determined in block 109 that the transition relation reduction is known for the variable being set to both 0 and 1 the method proceeds from 109 along the YES path to 113.

Block 113 determines the usage count for use in ranking the variables. The method then proceeds to 115 to assign a ranking value to the variable being analyzed. Upon completing 115 the method proceeds to 117 to determine whether there are other variables yet to be analyzed. If there are more variables the method proceeds from 117 along the YES branch to 103 to select the next variable. However, if it is determined in 117 that all the variables have been considered the method proceeds from 117 along the NO branch to 119. In block 119 the variables are ranked (or ordered) from most reduction to least reduction on the transition relation size. Other criteria that may be used for variable ranking include ranking data such as the usage count. The rank is used in ordering the variables, and in selecting (or eliminating) variable(s) to be used in hint generation. Once the variables are in their proper order the method proceeds to 121 and ends. The variables may now be used to create a hint for use in reachability analysis, or may be evaluated to remove the weakest variable.

Figure 2:
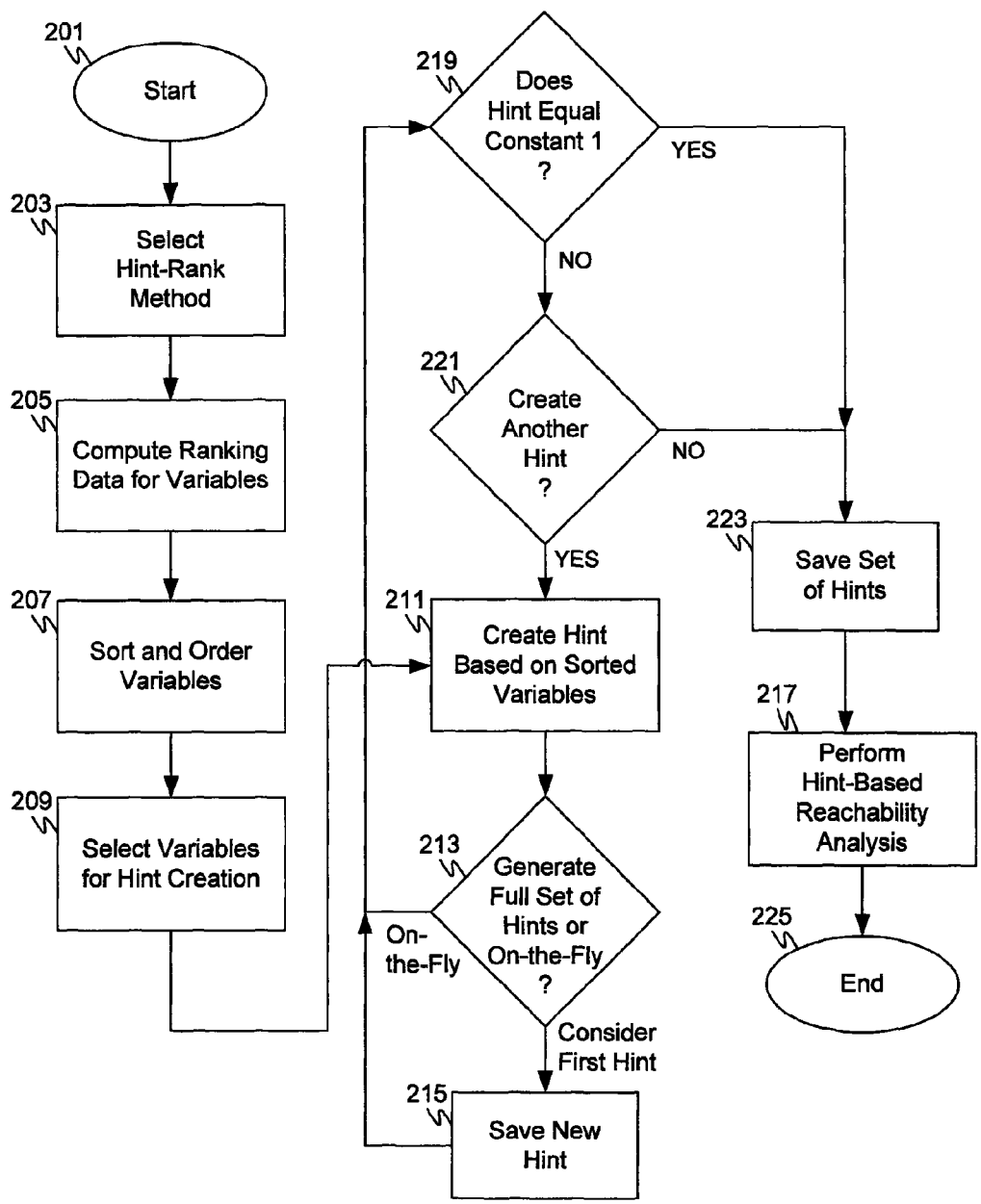
FIG. 2 is a flowchart for a method of generating hints for a reachability analysis according to various embodiments of the invention.

FIG. 2 is a flowchart for a method of generating hints for a reachability analysis according to various embodiments of the invention. There are several situations in which dynamic hint generation and application can be most readily applied. For example, the system can keep track of BDD node growth in an image calculation and apply the automatic hint generation upon reaching a predetermined level of growth. Another instance occurs when going from hint i to i+1. In this situation the system may re-rank the variables in order to decide what variable to remove from hint i in order to generate the next hint. The number of iteration steps during a reachability computation can be another determinant for applying dynamic hint generation. During each hint-based reachability computation we may set an iteration step limit or run time limit to terminate a hint computation before it reaches convergence. That helps the cases where one particular hint traverses the state space in a very suboptimal way and we have this control to terminate this inefficient search. For example, the design may include a counter with a parallel-data-load path. If the parallel-load input is enabled, the counter can converge to all count values in one reachability step. However, if the hint disables the parallel-load input, it may require one reachability step per count value which—although efficient—may require more overall runtime.

In order to find the best point in reachability analysis to launch the hints generation, the BDD variable ordering is monitored before each image. In this way the BDD variable ordering can be restored if the image calculation fails. A number of measures can be used to determine if hints are needed before or after the current image is computed. For example, some of the criteria useful for determining whether to use hints before or after computing the image include: the number of dynamic variable order (DVO) calls during the image calculation, the total DVO runtime during the image calculation, the average DVO runtime per call, the percentage increase in number of BDD nodes, and the total number of BDD nodes.

The BDD package provides pre/post-DVO hook functions we can use to keep track of how often DVO runs and how much time it takes. The heuristics are usually based on several factors. Some of the heuristics include: a BDD soft limit which will terminate a BDD computation if the number of live BDD nodes exceeds this limit, a threshold for the minimum number of nodes before hint generation will start, and a BDD node growth factor specifying the amount of growth necessary before hint generation will start.

One way to avoid blow-ups would be to have the reachability engine use the BDD node soft limit for the image calculation, more specifically, for the individual bdd_and_exist calls. The soft limit can also be set to the current number of nodes times the "node growth factor" described above. If the soft limit is hit during the image calculation then hints could be introduced. This would prevent spikes in node counts that may lead to memouts (overloading available memory) in an image step. Other criteria can also be applied besides using the soft limit. When these criteria are met, the reachability engine would generate a new set of hints (for example, by adding additional literals to the current hints) to continue the reachability analysis.

A number of advantages can be realized by practicing the various embodiments disclosed herein. For example, the various embodiments provide a more general method that can be applied in any reachability analysis framework and doesn't require the design data to be in a particular language format such as VHDL, or in a specific format e.g. with behavioral control-flow constructs. Another advantage is that, rather than being static in nature, the hints generation of the various embodiments disclosed herein is dynamic based on the BDD nodes count and order at any given point of the reachability computation (or other such parameter). Due to its dynamic nature the reachability computation will not get stuck and be forced to terminate at a given image step. In the various embodiments measures are taken to terminate a "bad hint" computation by setting iteration or time limits to avoid the inefficient traversal of a state space. Furthermore, the hints generated by the various embodiments are cubes and are well related to other subsequent hints and are likely enhance the exploration path. It should also be noted that the various embodiments allow use of the bdd_constrain operation to make the image computation more efficient. Among the features that distinguishes the various embodiments disclosed herein from convention systems is that it is purely automatic, operating on general bit-level netlists, to dynamically provide simplistic in the hints form that it try to generate that lowers the overhead.

Turning to FIG. 2, the method begins at 201 and proceeds to 203 to select a method of ranking hints. The variable ranking may be determined by criteria such as how much the transition relation is reduced in size if the variable is set to 0 (or 1), the usage count of the variable, or other such parameters. Multiple criteria may be used, with each being weighted to define its contribution towards a ranking value. Once the method of ranking hints is selected in 203 the method proceeds to 205. In block 205 the method computes the ranking data for the selected variables. The ranking may be performed according to the method described above in conjunction with FIG. 1. Once the ranking is complete the method proceeds to 207 to sort and order the variables based on the variable ranking. The variables may be sorted according to the ranking data and hint-rank-method option. For example, block 207 may order the variables from "most reduction" to least reduction on the transition relation size. In 209 the variables for use in creating hints are selected. The number of variables chosen for the first hint is controlled by two options, the hint-variable-limit option and the hint-reduction-percentage option. The hint-variable-limit option specifies a limit on the number of variables in the first hint. The hint-reduction-percentage specifies the percent reduction in the size of the transition relation at which point no more variables will be added.

Once the variables have been selected in 209 the method proceeds to 211 to create a hint. The hint is created based on the sorted variables. The method then proceeds to 213 to determine whether the hints are to be generated one at a time (on the fly) or generated all at once to create a full set of hints. For state variables it is often the case that they can take on only one value and still be consistent with the initial state or the current set of states. In some instances statically deriving hints before any reachability analysis is performed can result in a significant limitation on the number and possibly quality of the resulting hints. This observation supports the decision for us to compute the hints dynamically so that when choosing values for state variables we only need to be consistent with the current set of reached states—a superset of the initial states. Returning to block 213, if the hints are to be generated one at a time the method proceeds from 213 along the On-The-Fly branch to 215 to save the generated hint. The method then proceeds to 217 to perform hint-based reachability analysis, and then on to 223 where the method ends. Returning to block 213, if it is determined that a full set of hints is to be generated the method proceeds from 213 along the Full-Set branch to 219.

Block 219 determines whether the full set of hints has been completed. Each subsequent hint differs from the less, each having one less literal than its predecessor. The value of the final hint is a constant "1." If the previous hint that was generated has a value other than constant "1" then it is not the final hint in the set, and therefore the method proceeds from 219 along the NO path to 211 to create another hint. The hint creation process will continue to loop around until the full hint set has been reproduced. If the previous hint that was generated has a value of constant "1" then it is determined to be the final hint in the set and the method proceeds from 219 along the YES path to 221.

In block 221 the full set of hints is saved in a format appropriate for use in the reachability analysis. The method then proceeds from 221 to 217 to perform the hint-based reachability analysis. Upon completing the analysis the method proceeds to 223 and ends.

The following is a detailed pseudocode description of the hint generation algorithm.

```
Function: generate_hints (TR, constraints) /* TR is the transition
relation */
{
    ranks = rank_variables(TR, constraints);
    for (i = 0; i < ranks.size; i++) {
        hint = bdd_1;
        for (j = i; j < ranks.size; j++) {
            choose literal for ranks[j];
            hint = bdd_and(hint, literal);
        }
    }
    create last hint const 1;
}
Function: rank_variables(TR, constraints)
{
//Compute initial variable ranks for all variables.
for each BDD variable var {
    compute_variable_rank(ranks, var, constraints, TR);
}
sort ranks according to hint-rank-method
//Use initial ranking to determine first hint cube
hint_cube = bdd_1;
done = false;
while (!done) {
    done = true;
    foreach rank in ranks {
        choose literal based on best reduction of TR;
        newcube = bdd_and(cube, literal);
        if (new_cube does not satisfy constraints) {
            invalidate chosen polarity for the variable;
            re-sort ranks according to criteria;
            done = false;
            break;
        }
        else {
            hint_cube = new_cube;
            move current rank from ranks to final ranks;
            compute size reduction of TR;
            if (reduction exceeds hint-reduction-percentage or
                final_ranks size exceeds hint-variable-limit)
                break;
        }
    }
    return final_ranks;
}
compute_variable_rank(ranks, var, constraints, TR)
{
total_trsize = bdd_size_vec(TR.next state functions);
// usecount used in sorting of ranks
rank.usect = bdd_var_usecountQ;
// determine TR reduction if var is set to 1
```
-continued
```
if (positive polarity of var satisfies all constraints) {
    tmp = bdd_constrain_vec(TR.next_state functions, var);
    rank.one_reduction = totaLtr_size - bddsize_vec(tmp);
}
// determine TR reduction if var is set to 0
if (negative polarity of var satisfies all constraints) {
    tmp = bdd_constrain_vec(TR.next state functions,
    bdd_not(var)); rank.zero reduction = total_tr_size -
    bdd_size_vec(tmp);
}
add rank to ranks;
}
```

Figure 3:
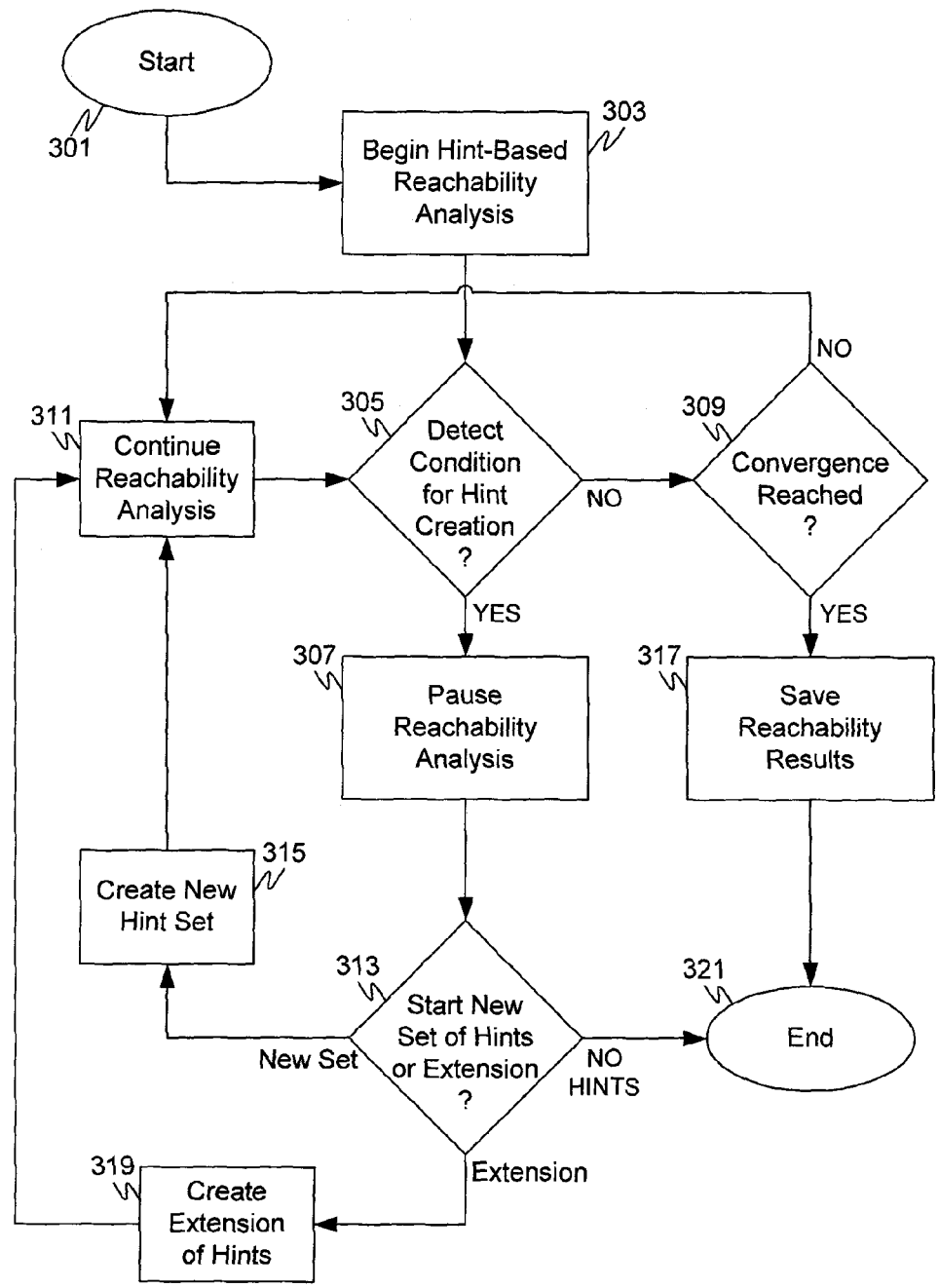
FIG. 3 is a flowchart for a method of performing a reachability analysis utilizing dynamic hint generation according to various embodiments of the invention.

FIG. 3 is a flowchart for a method of performing a reachability analysis utilizing dynamic hint generation according to various embodiments of the invention. The figure depicts how we incorporate the dynamic hints generation into our reachability analysis framework. The general idea is that the criteria for generating new hints may be met during computation of an image or the new set of reached states, in which case we typically continue the forward reachability computation from the current set of reached states with the new hints. The new hints may be a complete set of hints (if no original user hints were currently instantiated), or may be an extension of the current hint to aid in the fix point computation for that hint.

The FIG. 3 method starts at 301 and proceeds to 303 to begin the hint-based reachability analysis. Upon completing 303 the method proceeds to 305 to determine whether the conditions warrant creation of a new hint. If the conditions are such that no new hints are to be created the method proceeds to 309 to determine whether convergence has been reached or not. If it is determined in block 309 that the reachability analysis has not yet reached convergence, then the method proceeds from 309 along the NO branch to 311 to continue the reachability analysis. From block 311 the method proceeds to 305 to again determine whether the conditions warrant creation of a new hint.

Returning to block 305, if it is determined that a new hint should be created the method proceeds from 305 along the YES branch to 307 to pause the reachability analysis during creation of the new hint. The method then proceeds to 313 to determine whether a new set of hints or an extension of the existing hint set is to be generated, or the method is to be ended. In some instances the iterative hint generation and reachability analysis may be taking up an inordinate amount of computational resources, as measured by a number of computations, a computation time, or other resource parameter. In such situations the system can end the method without reaching convergence via the NO HINTS path from 313 to 321. However, if it is determined in 313 to create a new set of hints the method proceeds from 313 along the NEW SET path to 315 to create a new set of hints. Hint generation is discussed above, for example, in conjunction with FIG. 2. Once the new hint set is completed in 315 the method proceeds from 315 to 311. Returning to block 313, if one or more new hints are to be generated as an extension of the existing hint set the method proceeds from 313 along the EXTENSION path to 319. Once the hints have been generated in 319 the method proceeds to 311 to continue the reachability analysis. The method then loops back to 305 to determine whether another new hint is to be generated or not.

In block 305, if no more new hints are to be created the method again proceeds to 309. If, in block 309, it is determined that the reachability analysis has converged the method proceeds from 309 along the YES branch to 317 to save the reachability results. The method then proceeds to 321 and ends.

The following pseudocode describes this in more detail describe how to incorporate methods of dynamic hints generation into our reachability analysis framework:

```
Function: forward_reach(TR, hints, start_states)
{
  frontier = start_states;
  reached = start_states;
  cur_hint = VOID;
  while (hint = dyn_gen_next_hint(TR, cur_hint, constraints, status)) {
    cur..hint = hint;
    hintTR = apply_hint(TR, hint); /* constraining TR with hint */
    loop
    {
      compute_image(hint_Tk, frontier, image, status)
      if (image is VOID) /* image computation is aborted on
      current hint*/ break;
      frontier = compute_frontier(image, reached)
      if (frontier is empty) {
        status = done;
        break; /*current hint computation converged */
      }
      if (number of image steps for the current hint exceeds limit) {
        status = resource_maxout;
        break; /* current hint computation maxed out */
      }
      reached = bdd_or(reached, frontier);
    }
  }
}
Function: compute_image (TR, cur_state, image, status)
{
  foreach partition in TR {
    image = bddand_exist(partition.bdd, cur_state, partition.quantifier);
    if (image is VOID) {
      if (hint_criteria_met) {
        status = gen_new_hint;
      } else {
        status = resource_maxout;
      }
    } else {
      status = done;
    }
  }
}
Function: dyn_gen_next_hint (TR; cur_hint, constraints, status)
{
  if (cur_hint is not an automatic-generated hint && status is
  not gen_new_hint) {
    /*cur hint is a user defined hint and the hint computation is
    completed or maxed out*/
    next_hint = fetch next user defined hint;
  } else {
    if (status == gen_new_hint) {
      new_cube = calculate new hint cube;
      next_hint = cur_hint & new_cube;
    } else {
      /* cur_hint is automatically generated hint */
      /* status is resource maxout or cur_hint computation converged */
      /* dynamically create next hint from current hint */
      re-rank the variables in cur_hint to determine which to remove;
      next_hint = cur_hint remove the literal;
      reset hint criteria data;
    }
    return next hint;
  }
}
Function: bool hint_criteria_met
{
  /* may use other criteria (e.g. time-limits); one embodiment is
  as follows */
  return (total_bdd_nodes > hint_bdd node softlimit||
    (totaLbdd_.nodes / prey_total_odd_nodes) >
    hint_node_growth_factor|| exceeds_dvo_resource);
}
```

According to various embodiments, if an image computation step exceeds its resource allocation we will try to automatically generate hints to continue the computation more efficiently. It is possible that this process will diverge, for example, due to generating a great number of hints which each uncover a very small number of new states. But in practice, for a computation that can be finished without hints, it can generally be completed with automatically generated hints using a smaller memory consumption. For those computations that won't finish without hints, the present automatic methods provide an opportunity to tunnel through the difficult part of the image steps and complete the reachability analysis, overall enabling faster detection of design failures and the completion of proofs that otherwise would be infeasible.

Figure 4:
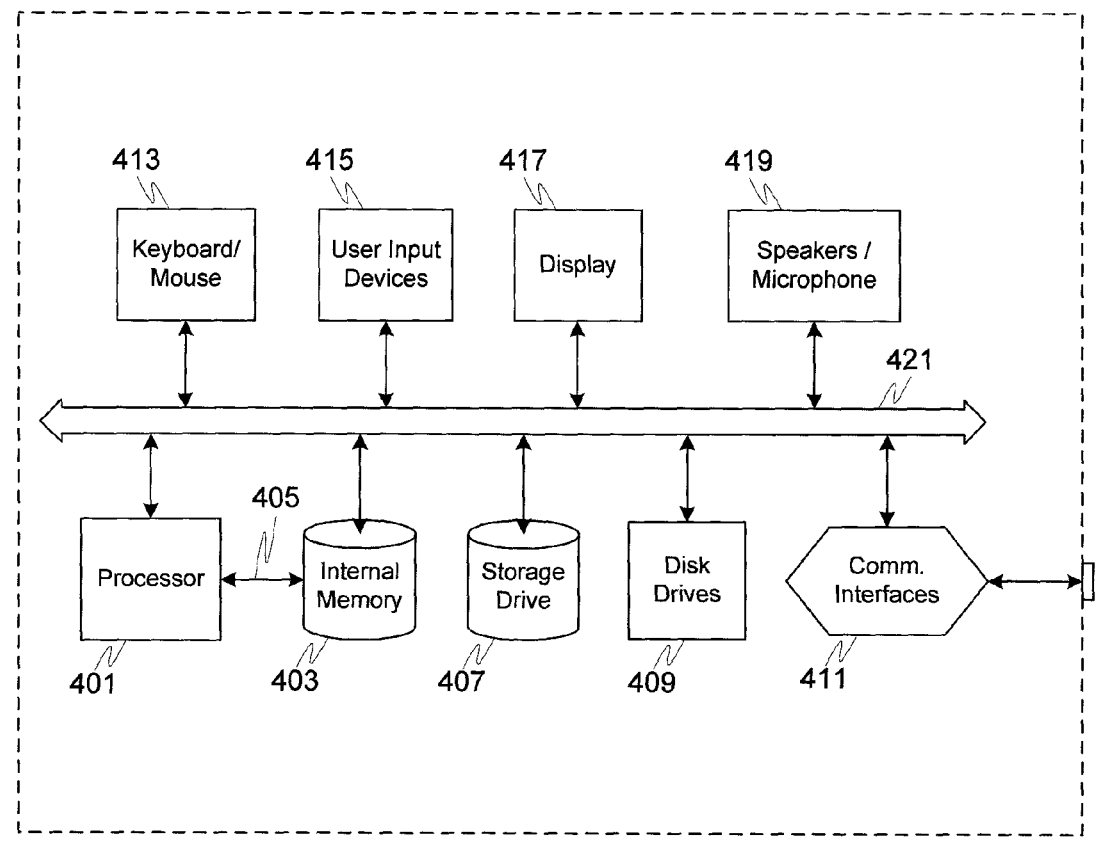
FIG. 4 depicts a computer system suitable for implementing and practicing various exemplary embodiments.

FIG. 4 depicts a computer system 400 suitable for implementing and practicing various exemplary embodiments. The computer system 400 may be configured in the form of a desktop computer, a laptop computer, a mainframe computer, or any other arrangements capable of being programmed or configured to carry out instructions. The computer system 400 may be located and interconnected in one location, or may be distributed in various locations and interconnected via a local or wide area network (LAN or WAN), via the Internet, via the public switched telephone network (PSTN), or other such communication links. Other devices may also be suitable for implementing or practicing the embodiments, or a portion of the embodiments. Such devices include personal digital assistants (PDA), wireless handsets (e.g., a cellular telephone or pager), and other such consumer electronic devices preferably capable of being programmed to carry out instructions or routines.

Typically, a computer system 400 includes a processor 401 which may be embodied as a microprocessor or central processing unit (CPU). The processor 401 is typically configured to access an internal memory 403 via a bus such as the system bus 421. The internal memory 403 may include one or more of random access memory (RAM), read-only memory (ROM), cache memory, or a combination of these or other like types of circuitry configured to store information in a retrievable format. In some implementations the internal memory 403 may be configured as part of the processor 401, or alternatively, may be configured separate from it but within the same packaging. The processor 411 may be able to access internal memory 403 via a different bus or control lines (e.g., local bus 405) than is used to access the other components of computer system 400.

The computer system 400 also typically includes, or has access to, one or more storage drives 407 (or other types of storage memory) and floppy disk drives 409. Storage drives 407 and the floppy disks for floppy disk drives 409 are examples of machine readable mediums suitable for storing the final or interim results of the various embodiments. The storage drive 407 is often a hard disk drive configured for the storage and retrieval of data, computer programs or other information. The storage drive 407 need not necessarily be contained within the computer system 400. For example, in some embodiments the storage drive 407 may be server storage space within a network or the Internet that is accessible to the computer system 400 for the storage and retrieval of data, computer programs or other information. For example, the computer system 400 may use storage space at a server storage farm accessible by the Internet 450 or other communications lines. The floppy disk drives 409 may include a combination of several disc drives of various formats that can read and/or write to removable storage media (e.g., CD-R, CD-RW, DVD, DVD-R, floppy disk, etc.). The computer system 400 may either include the storage drives 407 and floppy disk drives 409 as part of its architecture (e.g., within the same cabinet or enclosure and/or using the same power supply), as connected peripherals, or may access the storage drives 407 and floppy disk drives 409 over a network, or a combination of these. The storage drive 407 is often used to store the software, instructions and programs executed by the computer system 400, including for example, all or parts of the computer application program for carrying out various embodiments of the invention. The storage drive 407 may be configured to have several portions (e.g., directories within the memory) that contain various software, instructions and programs for carrying out the various embodiments and for storing the results or other data. For example, the storage drive 407 may have a first memory portion, a second memory portion, a third memory portion, and so on, for use in storing computer programs and data.

The computer system 400 may include communication interfaces 411 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 400 may be connected to the Internet via the wireless router 401 (or a wired router or other node—not show) rather than have a direct connected to the Internet. The components of computer system 400 may be interconnected by a bus 421 and/or may include expansion slots conforming to any of various industry standards such as PCI (Peripheral Component Interconnect), ISA (Industry Standard Architecture), or EISA (enhanced ISA).

Typically, the computer system 400 includes one or more user input/output devices such as a keyboard and/or mouse 413, or other means of controlling the cursor (e.g., touchscreen, touchpad, joystick, trackball, etc.) represented by the user input devices 415. The communication interfaces 411, keyboard and mouse 413 and user input devices 115 may be used in various combinations, or separately, as means for receiving information and other inputs to be used in carrying out various programs and calculations. A display 417 is also generally included as part of the computer system 400. The display may be any of several types of displays, including a liquid crystal display (LCD), a cathode ray tube (CRT) monitor, a thin film transistor (TFT) array, or other type of display suitable for displaying information for the user. The display 417 may include one or more light emitting diode (LED) indicator lights, or other such display devices. In addition, most computer systems 400 also include, or are connected to, one or more speakers and microphones 419 for audio output and input. Speech recognition software may be used in conjunction with the microphones 419 to receive and interpret user speech commands.

State holding elements, or state elements, are discussed above in terms of being implemented as registers or gates. However, in some embodiments any sort of state holding element or memory element may be used to implement various embodiments, including for example, registers, latches, state machines, or the like. For the purposes of illustrating and explaining the invention the terms variable, gate and register have been used interchangeably throughout this disclosure.

Various activities may be included or excluded as described above, or performed in a different order, while still remaining within the scope of at least one exemplary embodiment. For example, since reachability analyses are known to eventually converge the NO HINTS branch from block 313 of FIG. 3 may be omitted so that the analysis simply continues until convergence, without regard to the amount of resources it takes. Other steps or activities of the methods disclosed herein may be omitted or performed in a different manner while remaining within the intended scope of the invention. The method may be implemented through the addition and manipulation of circuitry to a design, hence is applicable for analysis using logic evaluation frameworks such as logic simulators or formal verification algorithms, as well as hardware-based frameworks such as hardware emulators/accelerators and even fabricated chips. Detection that design behavior is unaffected by the introduction of said multiplexer and associated logic may be used to indicate the opportunity to simplify said design for enhanced synthesis or verification, or to denote other desirable characteristics of said design, e.g. fault tolerance.

The invention may be implemented with any sort of processing units, processors and controllers (e.g., processor 401 of FIG. 4) capable of performing the stated functions and activities. For example, the processor 401 may be embodied as a microprocessor, microcontroller, DSP, RISC processor, or any other type of processor that one of ordinary skill would recognize as being capable of performing the functions described herein. A processing unit in accordance with at least one exemplary embodiment can operate computer software programs stored (embodied) on computer-readable medium such as the disk drives 409, the storage drive 407 or any other type of hard disk drive, CD, flash memory, ram, or other computer readable medium as recognized by those of ordinary skill in the art.

The computer software programs can aid or perform the steps and activities described above. For example computer programs in accordance with at least one exemplary embodiment may include: source code for determining a ranking of first plurality of variables for binary decision diagram; source code for sorting the first plurality of variables in order of the ranking; source code for selecting a second plurality of variables from among the first plurality of variables; source code for creating a hint based on the selected variables to be included in said hint set; and source code for performing a reachability analysis using said hint set. There are many further source codes that may be written to perform the stated steps and procedures above, and these are intended to lie within the scope of exemplary embodiments.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method, performed by execution of instructions loaded into a computer system, of dynamically generating a hint set for enhanced reachability analysis in a sequential circuitry design represented by a binary decision diagram, the method comprising:

determining a ranking of a first plurality of variables for a binary decision diagram;

sorting the first plurality of variables in order of the ranking, wherein the sorting is performed by execution of said instructions loaded into the computer system;

selecting a second plurality of variables from among the first plurality of variables;

creating a first hint based on the selected variables to be included in said hint set;

performing a hint based reachability analysis using said hint set, wherein a second hint to be included in said hint set is created after beginning the hint based reachability analysis, with interim results of said hint based reachability analysis being used to create the second hint; and creating a third hint as part of the hint set and determining that said third hint equals a constant value of "1", wherein said third hint is a last hint created in said hint set in response to determining that said third hint equals a constant value of "1".

2. The method of claim 1, wherein said ranking of the first plurality of variables is based on at least one of usage counts of each of the first plurality of variables or transition relation reductions of each of the first plurality of variables.

3. The method of claim 1, further comprising:
completing creation of said hint set before beginning said hint based reachability analysis.

4. The method of claim 1, further comprising:
creating hints on the fly during performance of said hint based reachability analysis.

5. The method of claim 1, further comprising:
creating one or more hints before creating the first hint, the second hint and the third hint.

6. A non-transitory machine readable device on which is stored a program of instructions for dynamically generating a hint set for enhanced reachability analysis in a sequential circuitry design represented by a binary decision diagram, wherein the program of instructions upon being executed on a computer causes the computer to perform activities comprising:

determining a ranking of a first plurality of variables for a binary decision diagram;

sorting the first plurality of variables in order of the ranking;

selecting a second plurality of variables from among the first plurality of variables;

creating a first hint based on the selected variables to be included in said hint set;

performing a hint based reachability analysis using said hint set, wherein a second hint to be included in said hint set is created after beginning the hint based reachability analysis, with interim results of said hint based reachability analysis being used to create the second hint; and creating a third hint as part of the hint set and determining that said third hint equals a constant value of "1", wherein said third hint is a last hint created in said hint set in response to determining that said third hint equals a constant value of "1".

7. The machine readable device of claim 6, wherein said ranking of the first plurality of variables is based on at least one of usage counts of each of the first plurality of variables or transition relation reductions of each of the first plurality of variables.

8. The non-transitory machine readable device of claim 6, the activities further comprising:
completing creation of said hint set before beginning said hint based reachability analysis.

9. The non-transitory machine readable device of claim 6, the activities further comprising:
creating hints on the fly during performance of said hint based reachability analysis.

10. The non-transitory machine readable device of claim 6, wherein the program of instructions further comprises:
creating one or more hints before creating the first hint, the second hint and the third hint.

11. A computer system comprising a memory and being configured to dynamically generate a hint set for enhanced reachability analysis in a sequential circuitry design represented by a binary decision diagram, the computer system comprising:

a first memory portion of a hard drive configured to store a ranking of a first plurality of variables for binary decision diagram ranked for hint creation;

a second memory portion of the hard drive configured to store a second plurality of variables from among the first plurality of variables for said hint creation;

a processor configured to execute instructions stored on said memory for creating a first hint based on the selected variables to be included in said hint set, wherein said instructions are further configured to perform a hint based reachability analysis using said hint set, wherein a second hint to be included in said hint set is created after beginning the hint based reachability analysis, with interim results of said hint based reachability analysis being used to create the second hint, and said instructions further being configured to create a third hint as part of the hint set and determining that said third hint equals a constant value of "1", wherein said third hint is a last hint created in said hint set in response to determining that said third hint equals a constant value of "1".

12. The computer system of claim 11, wherein said first memory portion of a hard drive stores the ranking of the first plurality of variables based on at least one of usage counts of each of the first plurality of variables or transition relation reductions of each of the first plurality of variables.

13. The computer system of claim 11, wherein said configured processor executes instructions further configured to complete creation of said hint set before beginning said hint based reachability analysis.

14. The computer system of claim 11, wherein said configured processor executes instructions further configured to create hints on the fly during performance of said hint based reachability analysis.

15. The computer system of claim 11, wherein said memory configured to dynamically generate said hint set generates said hint set to include more hints than said first hint, said second hint and said third hint.

\* \* \* \* \*